United States Patent
Kirby et al.

(10) Patent No.: US 10,312,142 B2
(45) Date of Patent: Jun. 4, 2019

(54) METHOD OF FORMING SUPERCONDUCTOR STRUCTURES

(71) Applicants: Christopher F. Kirby, Gambrills, MD (US); Michael Rennie, Ashland, VA (US); Daniel J. O'Donnell, Manassas, VA (US); Sandro J. Di Giacomo, Ellicott City, MD (US)

(72) Inventors: Christopher F. Kirby, Gambrills, MD (US); Michael Rennie, Ashland, VA (US); Daniel J. O'Donnell, Manassas, VA (US); Sandro J. Di Giacomo, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 325 days.

(21) Appl. No.: 15/362,400

(22) Filed: Nov. 28, 2016

(65) Prior Publication Data

US 2018/0151430 A1    May 31, 2018

(51) Int. Cl.
*H01L 21/00* (2006.01)
*H01L 21/768* (2006.01)
(Continued)

(52) U.S. Cl.
CPC .. *H01L 21/76891* (2013.01); *H01L 21/02063* (2013.01); *H01L 21/0273* (2013.01);
(Continued)

(58) Field of Classification Search
CPC ......... H01L 21/76891; H01L 21/76802; H01L 23/53285; H01L 23/5226; H01L 23/528;
(Continued)

(56) References Cited

U.S. PATENT DOCUMENTS 6,177,347 B1    1/2001  Liu et al.
7,259,091 B2    8/2007  Schuehrer et al.
(Continued)

FOREIGN PATENT DOCUMENTS

WO        2002013234 A2    2/2002

OTHER PUBLICATIONS

International Search Report for corresponding PCT/2017/058506, dated Feb. 16, 2018.

*Primary Examiner* — Vu A Vu
(74) *Attorney, Agent, or Firm* — Tarolli, Sundheim, Covell & Tummino LLP

(57) ABSTRACT

A method of forming a superconductor structure is provided. The method comprises forming a superconducting element in a first dielectric layer that has a top surface aligned with the top surface of the first dielectric layer, forming a second dielectric layer over the first dielectric layer and the superconducting element, and forming an opening in the second dielectric layer to a top surface of the superconducting element. The method also comprises performing a cleaning process on the top surface of the superconducting element to remove oxides formed on the top surface of the superconducting element at a first processing stage, forming a protective barrier over the top surface of the superconducting element, and moving the superconductor structure to a second processing stage for further processing.

20 Claims, 6 Drawing Sheets

(51) Int. Cl.

| | |
|---|---|
| *H01L 21/02* | (2006.01) |
| *H01L 21/027* | (2006.01) |
| *H01L 21/311* | (2006.01) |
| *H01L 21/321* | (2006.01) |
| *H01L 23/522* | (2006.01) |
| *H01L 23/528* | (2006.01) |
| *H01L 23/532* | (2006.01) |
| *H01L 23/66* | (2006.01) |
| *H01L 39/12* | (2006.01) |
| *H01L 39/24* | (2006.01) |
| *H01P 3/08* | (2006.01) |
| *H01P 11/00* | (2006.01) |

(52) U.S. Cl.
CPC .. *H01L 21/02074* (2013.01); *H01L 21/31116* (2013.01); *H01L 21/3212* (2013.01); *H01L 21/7684* (2013.01); *H01L 21/7685* (2013.01); *H01L 21/76802* (2013.01); *H01L 21/76814* (2013.01); *H01L 21/76849* (2013.01); *H01L 21/76877* (2013.01); *H01L 21/76883* (2013.01); *H01L 23/528* (2013.01); *H01L 23/5226* (2013.01); *H01L 23/53285* (2013.01); *H01L 23/66* (2013.01); *H01L 39/12* (2013.01); *H01L 39/2406* (2013.01); *H01P 3/081* (2013.01); *H01P 11/003* (2013.01); *H01L 2223/6627* (2013.01)

(58) Field of Classification Search
CPC ........... H01L 21/02063; H01L 21/7685; H01L 39/2406; H01L 21/7684; H01L 21/3212; H01L 21/76877; H01L 21/0273; H01L 21/02074; H01L 39/12; H01L 23/66; H01L 2223/6627; H01L 21/31116; H01P 11/003; H01P 3/081
USPC .......................................................... 438/2
See application file for complete search history.

(56) References Cited

U.S. PATENT DOCUMENTS

| | | | |
|---|---|---|---|
| 7,341,978 | B2 | 3/2008 | Gu et al. |
| 7,498,242 | B2 | 3/2009 | Kumar et al. |
| 8,324,095 | B2 | 12/2012 | Chung et al. |
| 2003/0178474 | A1* | 9/2003 | Jiang .................... H01L 21/563 228/205 |
| 2015/0119252 | A1* | 4/2015 | Ladizinsky ............ B82Y 10/00 505/170 |
| 2015/0179918 | A1* | 6/2015 | Greer .................. H01L 39/2493 505/329 |

* cited by examiner

METHOD OF FORMING SUPERCONDUCTOR STRUCTURES

This invention was made with Government support under Contract No. 300694.13. The Government has certain rights in this invention.

TECHNICAL FIELD

The present invention relates generally to superconductors, and more particularly to a methodology for forming superconductor structure.

BACKGROUND

Superconducting circuits are one of the leading technologies proposed for quantum computing and cryptography applications that are expected to provide significant enhancements to national security applications where communication signal integrity or computing power are needed. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Recently there has been a movement to mass producing superconducting circuits utilizing similar techniques as those utilized in conventional semiconductor processes.

One well-known semiconductor process is the formation of contacts and conductive lines in a multi-level interconnect stack to couple devices to one another over different layers of an integrated circuit. One such fabrication process for formation of conductive contacts and lines is known as a dual damascene process. This technique has recently been attempted in the formation of superconducting circuits. During the fabrication of dual damascene superconducting circuits, via/trench structures are patterned, etched, filled with metal (e.g., niobium, tantalum, aluminum), then polished back using a chemical mechanical polishing (CMP) process. The next level dielectric is then deposited, and the sequence begins again, building up a multi-level interconnect stack. The CMP process and any exposure to oxygen prior to deposition of the next dielectric layer can result in oxidization of the conductive contacts and lines, and dielectric layers which degrades performance.

SUMMARY

In one example, a method of forming a superconductor structure is provided. The method comprises forming a superconducting element in a first dielectric layer that has a top surface aligned with the top surface of the first dielectric layer, forming a second dielectric layer over the first dielectric layer and the superconducting element, and forming an opening in the second dielectric layer to a top surface of the superconducting element. The method also comprises performing a cleaning process on the top surface of the superconducting element to remove oxides formed on the top surface of the superconducting element at a first processing stage, forming a protective barrier over the top surface of the superconducting element, and moving the superconductor structure to a second processing stage for further processing.

In yet another example, a method of forming a superconductor structure is provided. The method comprises forming a first opening in a first dielectric layer overlying a substrate, performing an etch to remove oxides from the first dielectric layer caused by the forming of the first opening, forming a first superconductive line in the first opening having a top surface aligned with a top surface of the first dielectric layer, and performing a first cleaning process on the top surface of the first superconductive line and the top surface of the first dielectric layer to remove oxides from the top surface of the first superconductive line and the top surface of the first dielectric layer. The method also comprises forming a second dielectric layer over the first dielectric layer and the first superconductive line, forming a via opening in the second dielectric layer to a top surface of the superconductive line, and a trench opening surrounding the via opening and partially extending into the second dielectric layer, and performing a second cleaning process on the top surface of the first superconductive line to remove oxides formed on the top surface of the first superconductive line and the remaining portions of the superconductor structure. The method further comprises forming a protective barrier over the top surface of the first superconductive line at a first processing stage to mitigate oxide formation over the top surface of the superconductive line, moving the superconductor structure to a second processing stage for further processing, removing the protective barrier, and forming a contact in the via opening and a second conductive line in the trench opening.

In yet a further example, a method of forming a superconductor interconnect structure is provided that comprises forming a first dielectric layer overlying a substrate, forming a patterned photoresist layer with an opening overlying the first dielectric layer, etching the first dielectric layer to form an extended opening in the first dielectric layer based on the opening in the photoresist layer, stripping the photoresist layer, and performing a wet etch to remove the oxide layer on the first dielectric layer caused by the stripping of the photoresist layer. The method also comprises performing a contact material fill to fill the extended opening and form a first superconductive line, performing a chemical mechanical polish (CMP) to align a top surface of the first superconductive line with a top surface of the first dielectric layer, performing a first cleaning process on the top surface of the first superconductive line and the first dielectric layer to remove oxides formed on the top surface of the first superconductive line and the top surface of the first dielectric layer, and forming a second dielectric layer over the first dielectric layer and the first superconductive line.

The method also comprises forming a via opening in the second dielectric layer to a top surface of the first superconductive line, and a trench opening surrounding the via opening and partially extending into the second dielectric layer, performing a second cleaning process on the top surface of the first superconductive line to remove oxides formed on the top surface of the first superconductive line during the forming of the via opening and trench opening, forming a first protective barrier over the top surface of the superconducting element, and moving the superconductor structure to a subsequent stage for further processing. The method yet further comprises performing an argon sputter clean to remove the protective barrier, performing a superconducting contact material fill to fill the via opening and the trench opening to form a contact in the via opening and a second conductive line in the trench opening, performing a chemical mechanical polish (CMP) to align a top surface of the second conductive line with a top surface of the second dielectric layer, performing a third cleaning process to remove oxides formed on a top surface of the second dielectric layer and the top surface of the second conductive line, and forming a second protective barrier on the top surface of the second conductive line to protect the second conductive line from further oxidization when being moved to a subsequent stage for further processing.

DETAILED DESCRIPTION

The present invention is directed to a method for forming superconducting elements (e.g., conductive lines, contacts, microstrips, coplanar waveguides, stripline transmission lines, filter designs) in superconductor structures. The method incorporates a preclean process to remove oxide layers from superconducting metal elements followed by formation of a protective barrier over the superconducting metal elements when moved to subsequent processing stages to protect the elements from oxides. The oxides can be as a result of a chemical mechanical process (CMP), and/or as a result of the exposure of the superconductor interconnect structure to oxygen outside of a vacuum environment. In one example, the method integrates the preclean process and protective barrier formation into a dual damascene process for scaling into a high density multilevel interconnect submicron technology. The method can employ a tetrafluoromethane ($CF_4$) (fluorine) based plasma clean etch process and a nitridation formation process prior to dielectric deposition of a next layer in the dual damascene process to assure a smooth clean surface of the metal interconnect elements on the underlying layer when moving between process locations.

The process enhanced method reduces the RF losses associated with the interfaces surrounding the signal line. RF losses cause signal degradation due to the dissipation factor of the surrounding materials. The materials can deplete the energy of the signal line due to the bulk dielectric or interfaces between the signal line and dielectric material. One of the major sources for signal loss is the unintended formation of dielectric oxides, as well as metal oxides (e.g., niobium oxide) created during chemical mechanical polishing (CMP) processes and photoresist strip. In one example employing niobium as a superconducting metal for forming the superconducting elements, the methodology removes these unintended oxides and create niobium nitride layers which inhibit oxidation of niobium.

Figure 1:
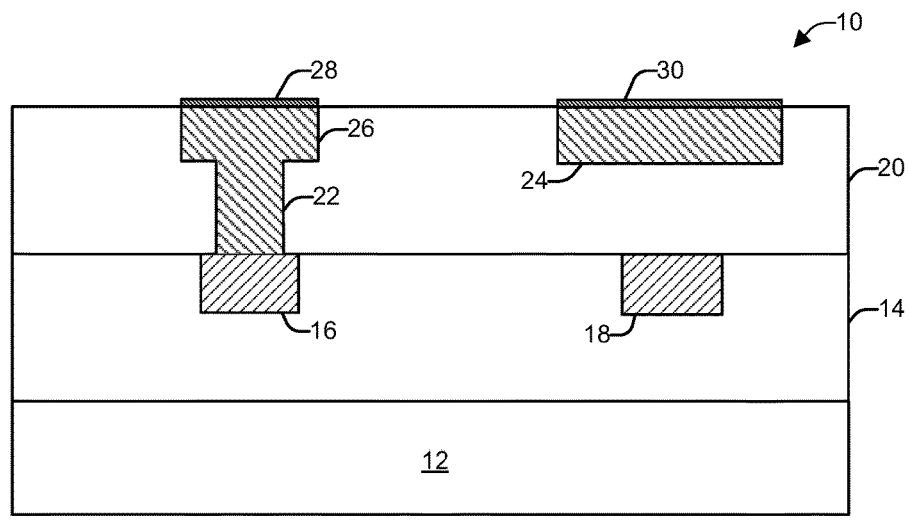
FIG. 1 illustrates cross-sectional view of a superconductor interconnect structure.

FIG. 1 illustrates cross-sectional view of a superconductor interconnect structure 10. The superconductor interconnect structure 10 includes a substrate 12 that can be formed of silicon, glass or other substrate material. A first dielectric layer 14 overlies the substrate 12, and a second dielectric layer 20 overlies the first dielectric layer 14. Both the first and the second dielectric layers 14 and 20 can be formed of a low temperature dielectric material that can be employed in low temperatures (e.g., less than or equal to 160 degrees Celsius) typically utilized in the formation of superconducting devices.

A first superconductive line 16 and a second superconductive line 18 are embedded in the first dielectric layer 14. A superconductive contact 22 extends from the first superconductive line 16 at a first end to a third superconductive line 26 in the second dielectric layer 20. A fourth superconductive line 24 is disposed in the second dielectric layer 20 above and isolated from the second conductive line 18 in the first dielectric layer 14. Each of the superconductive contact and superconductive lines are formed of a superconducting material, such as niobium. A first protective barrier 28 overlies a top surface of the third superconductive line 26 and a second protective barrier 30 overlies a top surface of the fourth superconductive line 24. The first and second protective barriers 28 and 30 can be formed from, for example, niobium nitride. The first and second protective barriers 28 and 30 protect the top surfaces of the third and fourth superconductive lines 26 and 24 from oxidation, which effects superconducting performance, when being transported between process stages and/or chambers for further processing.

Turning now to FIGS. 2-13, fabrication is discussed in connection with formation of interconnects in the superconducting device of FIG. 1. The present example will be illustrated with respect to two single damascene conductive lines etched into a dielectric thin film to form bottom conductive lines followed by a dual damascene process to form top conductive lines. The methodology demonstrates the techniques used to reduce the RF and microwave losses of the dielectric material inherent to oxides of a superconductor interconnect such as niobium as applied to the design of microstrip, coplanar waveguide and stripline transmission lines and filter designs using resonant frequency of a dielectric material. The process flow example described in FIGS. 2-13 will form a microstrip transmission line using a dual damascene method to create the superconducting wires within the dielectric material. Niobium oxides are removed and replaced by superconducting niobium nitride using either in-situ and/or ex-situ to the dielectric used for the resonating material.

Figure 2:
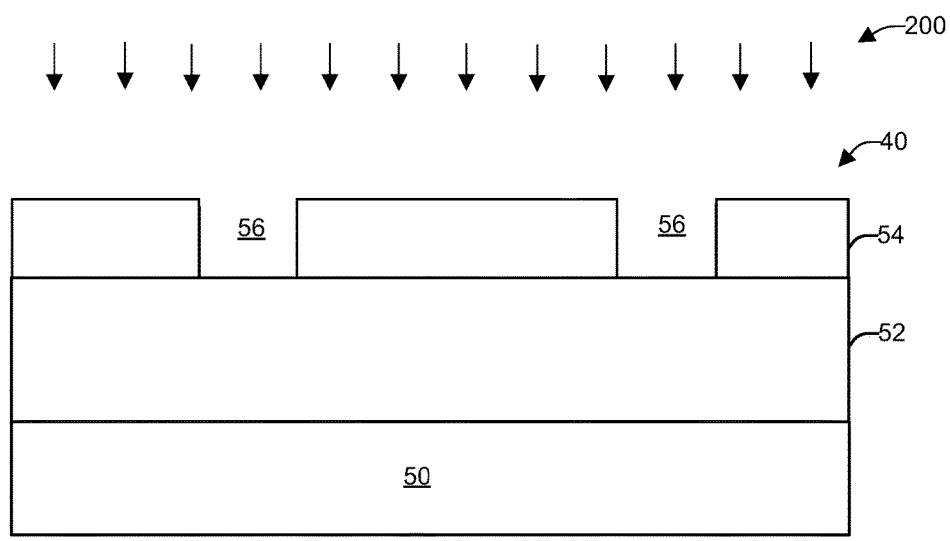
FIG. 2 illustrates a schematic cross-sectional view of an example of a superconductor structure in its early stages of fabrication, and while undergoing an etch process.

FIG. 2 illustrates a cross-sectional view of a superconductor structure in its early stages of fabrication. The superconductor structure resides in an etch chamber for forming vias and trenches in one or more dielectric layers. The superconductor structure 40 includes a first dielectric layer 52 deposited over an underlying substrate 50. The underlying substrate 50 can be, for example, a silicon or glass wafer that provides mechanical support for subsequent overlying layers. Any suitable technique for forming the first dielectric layer 52 may be employed such as Low Pressure Chemical Vapor Deposition (LPCVD), Plasma Enhanced Chemical Vapor Deposition (PECVD), High Density Plasma Chemical Vapor Deposition (HDPCVD), sputtering or spin-on techniques to a thickness suitable for providing an interconnect layer. A typical dielectric material to use for the first dielectric layer 52 would be a silicon rich film with low levels of oxygen and hydrogen.

As illustrated in FIG. 2, a photoresist material layer 54 has been applied to cover the structure and patterned and developed to expose trench openings 56 in the photoresist material layer 54 in accordance with a trench pattern. The photoresist material layer 54 can have a thickness that varies in correspondence with the wavelength of radiation used to pattern the photoresist material layer 54. The photoresist material layer 54 may be formed over the first dielectric layer 52 via spin-coating or spin casting deposition techniques, selectively irradiated (e.g., via deep ultraviolet (DUV) irradiation) and developed to form the trench openings 54.

Figure 3:
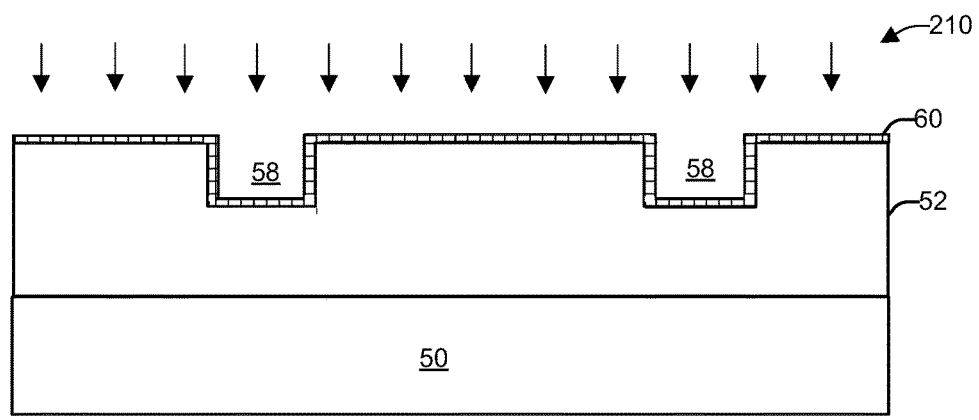
FIG. 3 illustrates a schematic cross-sectional view of the structure of FIG. 2 after undergoing an etch process and while undergoing a wet etch.
Figure 4:
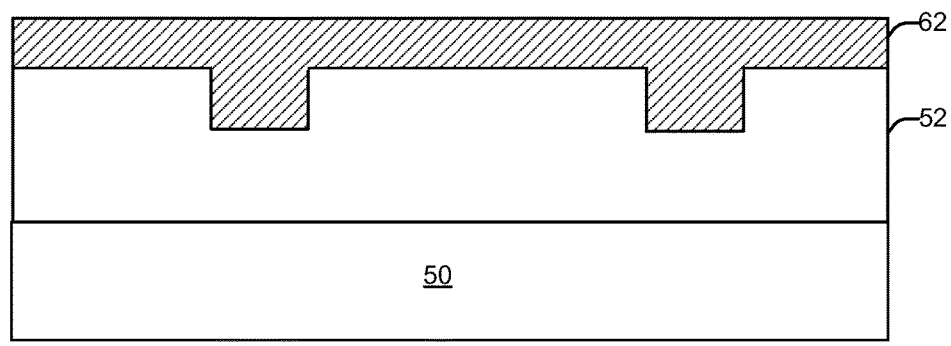
FIG. 4 illustrates a schematic cross-sectional view of the structure of FIG. 3 after a contact material fill in a material deposition chamber.
Figure 5:
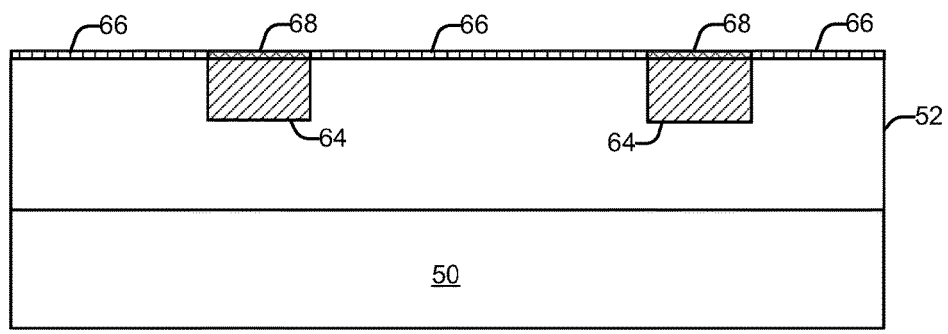
FIG. 5 illustrates a schematic cross-sectional view of the structure of FIG. 4 after undergoing a chemical mechanical polish.

FIG. 2 also illustrates performing of an etch 200 (e.g., anisotropic reactive ion etching (RIE)) on the first dielectric layer 52 to form extended trench openings 58 (FIG. 3) in the first dielectric layer 52 based on the trench pattern in the photoresist material layer 54. The etch step 200 can be a dry etch and employ an etchant which selectively etches the underlying first dielectric layer 52 at a faster rate than the overlying photoresist material layer 54. For example, the first dielectric layer 52 may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 54 to thereby create the extended trench openings 58. The photoresist material layer 54 is thereafter removed using an oxygen based plasma and wet cleaned to remove organic residues. As a result of the oxygen exposure, the etched dielectric surface will have layers of silicon dioxide 60 as illustrated in FIG. 3.

Silicon dioxide is known to have high losses at RF and microwave frequencies. The oxide layer 60 is removed using an hydrofluoric acid wet etch 210 in a wet etch chamber, as illustrated in FIG. 3. Next, the structure is placed into a material deposition chamber. The structure undergoes an argon pre-clean in-situ to remove any monolayers of native oxide grown during movement of the structure from the wet clean to the deposition chamber. The structure then undergoes a contact material fill to deposit a superconducting material 62, such as niobium, into the trench openings 58 to form the resultant structure shown in FIG. 4. The contact material fill can be deposited employing a standard contact material deposition. Following deposition of the contact material fill, the superconducting material 62 is moved into a polish chamber and is polished via chemical mechanical polishing (CMP) down to the surface level of the dielectric layer 52 to planarize the surface of the conductor level. The CMP utilizes a slurry which is selective to the dielectric layer 52 to form superconductive lines 64 and provide the resultant structure of FIG. 5.

The slurry used to polish the metal niobium contains a peroxide component and results in a surface layer of about 100 A niobium oxide 68 overlying the first and second superconductive lines and a dielectric oxide 66 of about 50 A overlying the first dielectric layer 52. The presence of this niobium oxide will degrade the performance of the superconducting circuits (losses in the metal lines), so it needs be removed prior to the deposition of the next dielectric layer. Since these surface thin films can cause high losses, a reactive clean is used to remove the niobium oxide 68 and the dielectric oxide 66 using a fluorine based plasma etch chemistry. This reactive clean can be done either ex-situ to the deposition chamber, for example, plasma etch chamber clustered to a PECVD chamber on a vacuum mainframe with low background level oxygen concentration, or in-situ to the deposition i.e., reactive clean process as part of a recipe sequence prior to the deposition process.

Figure 6:
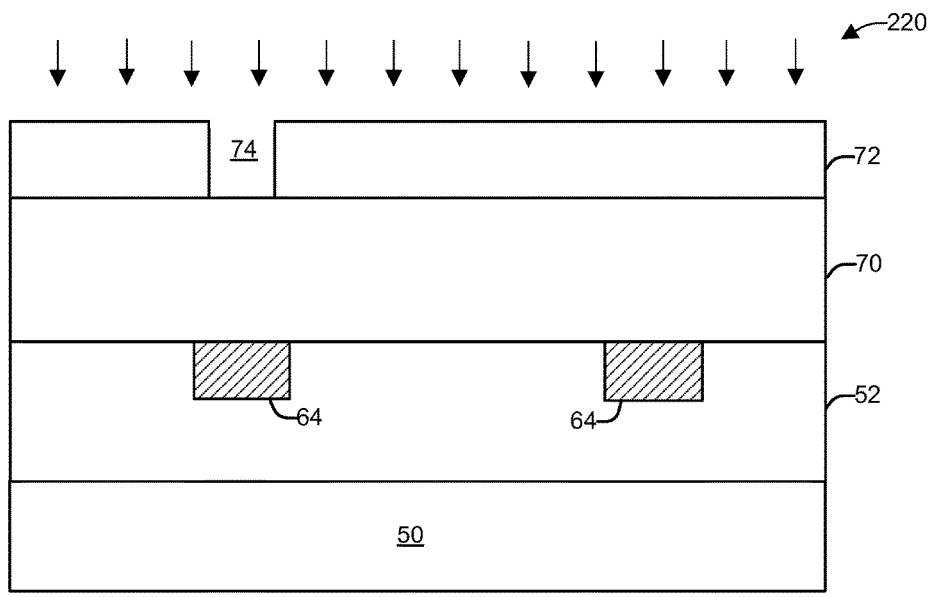
FIG. 6 illustrates a schematic cross-sectional view of the structure of FIG. 5 after deposition of a second dielectric layer and while undergoing an etch process.
Figure 7:
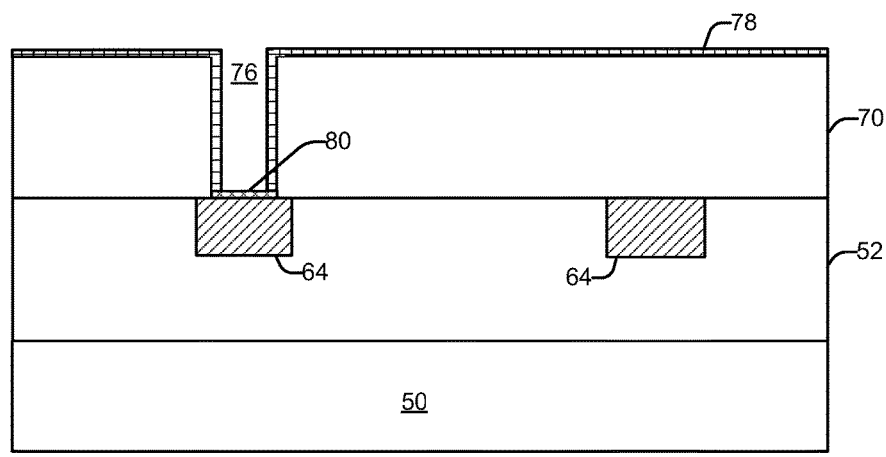
FIG. 7 illustrates a schematic cross-sectional view of the structure of FIG. 6 after undergoing an etch process.

As illustrated in FIG. 6, the superconductor structure with the cleaned top surface is then moved to a deposition chamber to undergo a subsequent dielectric deposition process for forming the next interconnect layer in the superconductor interconnect structure. The resultant structure is illustrated in FIG. 6 with a second dielectric layer 70 overlying the structure and encapsulating the first and second superconductive lines 64.

A photoresist material layer 72 is applied to cover the structure and is then patterned (e.g., DUV imaged) and developed to expose an open region 74 in the photoresist material layer 72 in accordance with a via pattern. FIG. 6 also illustrates performing of an etch 220 on the second dielectric layer 70 to form extended via opening 76 (FIG. 7) in the second dielectric layer 70 based on the via pattern in the photoresist material layer 72. The extended via opening 76 extends to one of the first superconductive lines 64. The etch 220 utilizes the same plasma chemistry described before for the first dielectric layer 52. The photoresist material layer 72 is thereafter stripped so as to result in the structure shown in FIG. 7. After the photoresist strip using oxygen plasma, another dielectric oxide layer 78 and a layer of niobium oxide 80 are formed.

Figure 8:
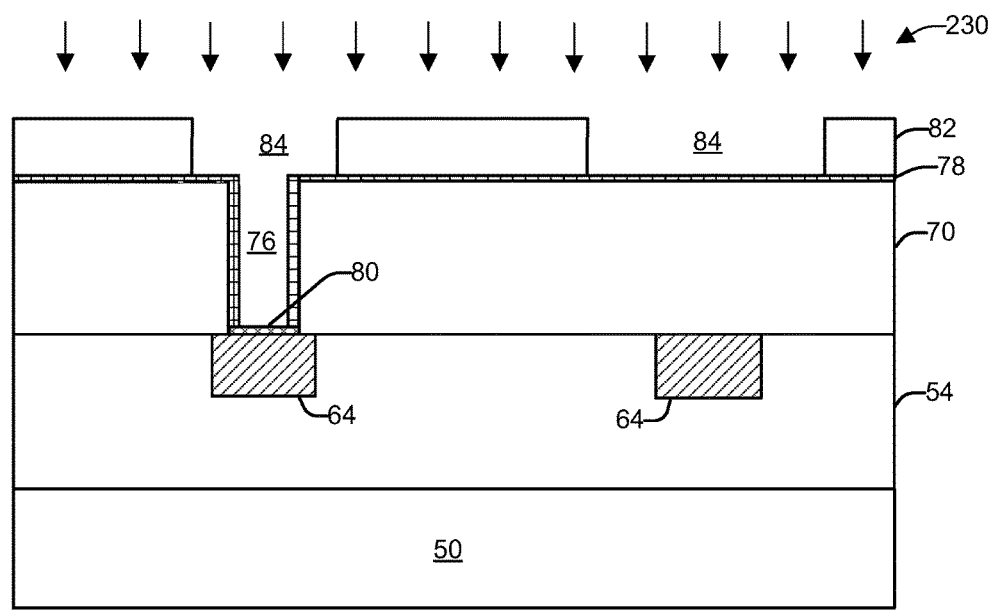
FIG. 8 illustrates a schematic cross-sectional view of the structure of FIG. 7 while undergoing an etch process.

As represented in FIG. 8, a photoresist material layer 82 is applied to cover the structure and is then patterned and developed to expose open trench regions 84 in the photoresist material layer 82 in accordance with a trench pattern. FIG. 8 also illustrates performing of an etch 230 (e.g., anisotropic reactive ion etching (RIE)) on the second dielectric layer 70 to form extended openings 86 and 88 (FIG. 9) that partially extend into the second dielectric layer 70 based on the trench pattern in the photoresist material layer 82. The etch 230 also removes the layer of niobium oxide and portions of the dielectric oxide not covered by the photoresist material layer 82. The photoresist material layer 82 is thereafter stripped so as to result in the structure shown in FIG. 9. After the photoresist strip, another dielectric oxide layer 79 and a layer of niobium oxide 81 are formed.

Figure 9:
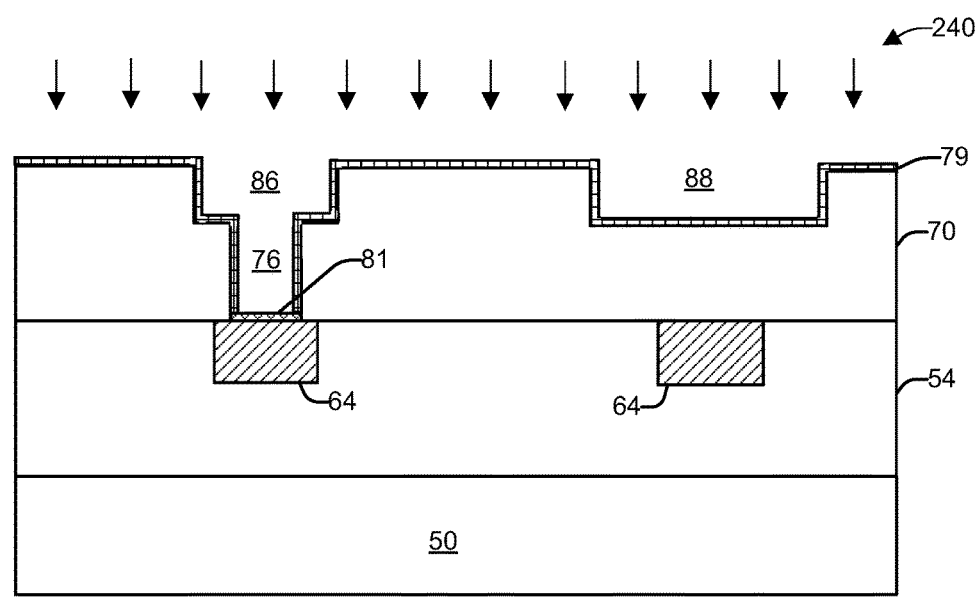
FIG. 9 illustrates a schematic cross-sectional view of the structure of FIG. 8 after undergoing an etch process, and while undergoing a reactive clean.
Figure 10:
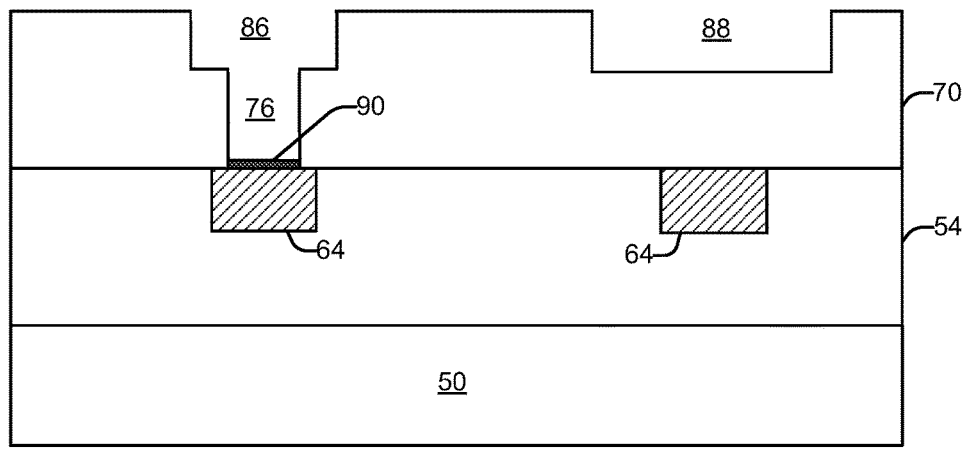
FIG. 10 illustrates a schematic cross-sectional view of the structure of FIG. 9 after undergoing a nitridation process.
Figure 11:
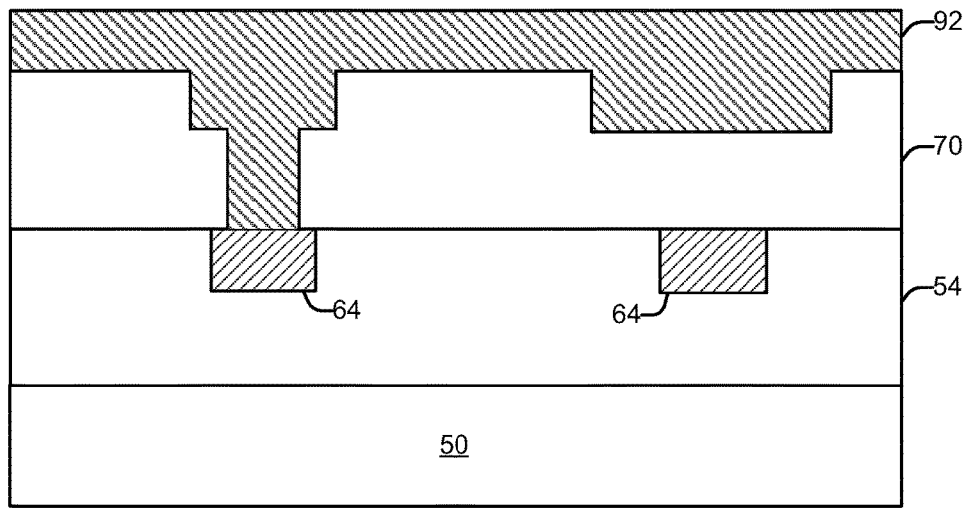
FIG. 11 illustrates a schematic cross-sectional view of the structure of FIG. 10 after an argon sputter clean and after undergoing a contact material fill in a material deposition chamber.
Figure 12:
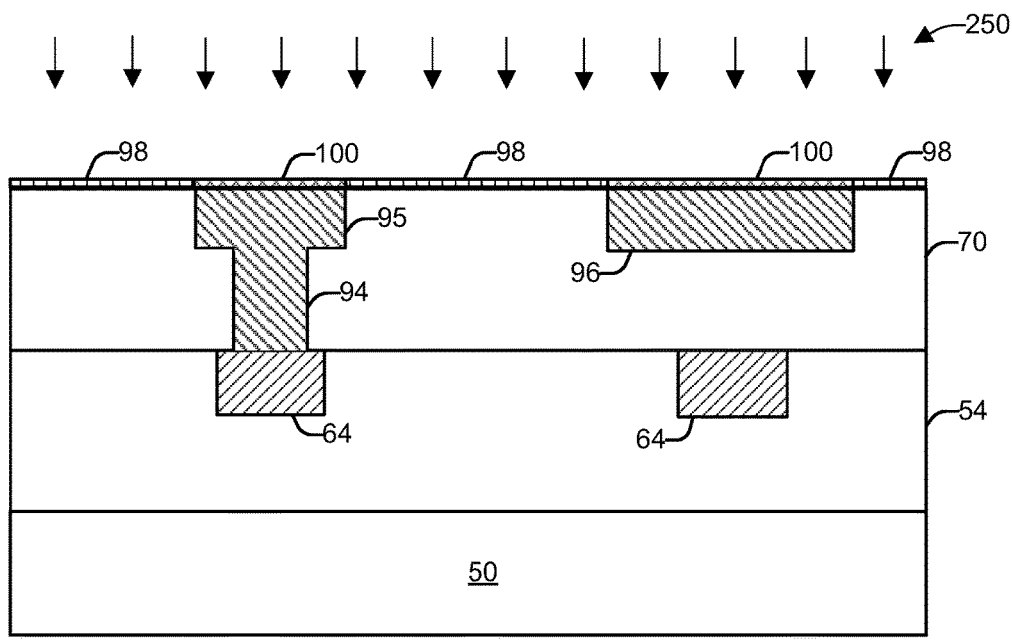
FIG. 12 illustrates a schematic cross-sectional view of the structure of FIG. 11 after undergoing a chemical mechanical polish.

FIG. 9 also illustrates simultaneous removal of the resulting dielectric oxide 79 and niobium oxide 81 using a fluorine based plasma etch 240 and selective growing of a subsequent niobium nitride layer using a nitrogen plasma to form a niobium nitride barrier 90 (FIG. 10). A typical plasma etch chamber can be used perform these functions. The two process oxide clean and nitridation are done ex-situ to the PVD chamber so that non-line of sight areas of the structure are cleaned using a plasma etch chamber. The niobium nitride barrier 90 is grown to passivate the surface and therefore inhibit further oxidation of the conductor level. The resultant structure is illustrated in FIG. 10.

Figure 13:
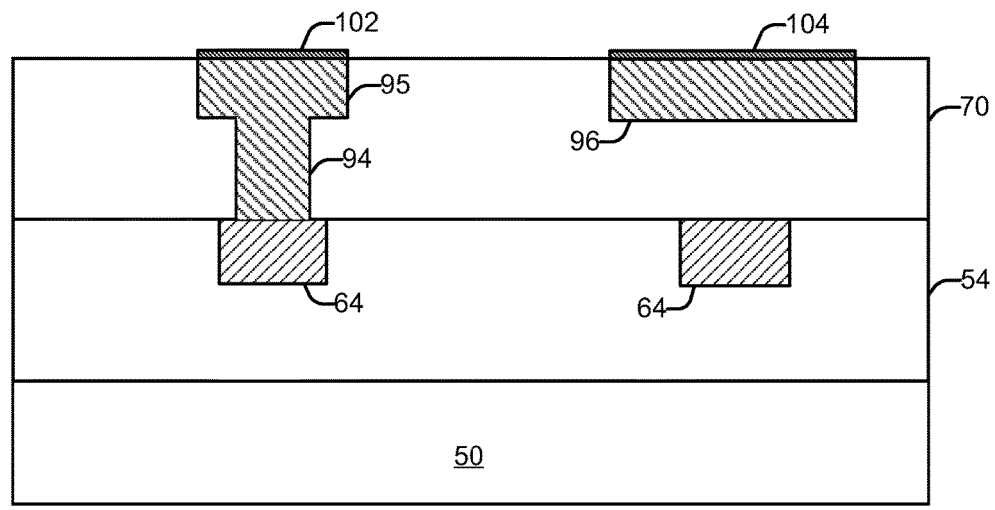
FIG. 13 illustrates a schematic cross-sectional view of the structure of FIG. 12 after undergoing a nitridation process.

Next, the niobium nitride barrier 90 is removed using an argon pre-clean in-situ to the PVD niobium chamber which is line of sight. The structure undergoes a contact material fill to deposit superconducting material 92, such as niobium, into the via 76 and trenches 86 and 88 employing a standard contact material deposition to provide the resultant structure in FIG. 11. Following deposition of the contact material fill, the contact material is polished via chemical mechanical polishing (CMP) down to the surface level of the second dielectric layer 70 to provide the resultant structure in FIG. 12. The resultant structure of FIG. 12 includes a third superconductive line 95 and a fourth superconductive line 96, another dielectric oxide layer 98 overlying the second dielectric layer 70 and another niobium oxide layer 100 overlying the top surface of the third superconductive line 95 and the fourth superconductive line 96. Another fluorine based plasma etch is performed on the structure of FIG. 12 to remove the dielectric oxide layer 98 and the niobium oxide layer 100. Finally, the structure is completed with a niobium nitridation process to provide a first niobium nitride barrier 102 overlying the third superconductive line 95 and a second niobium nitride barrier 104 overlying the fourth superconductive line 86 to prevent oxidation of the niobium during transfer of the structure to the next process and/or chamber. The final resultant structure is illustrated in FIG. 13.

Since the electric fields between the conductor and ground plane occur across the dielectric, the niobium nitride layer does not contribute to losses of the microstrip. The process flow concept described here can be extended to the formation of stripline as well as multilevel transmission line formation in the vertical plane.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor structure, the method comprising:
    forming a superconducting element in a first dielectric layer, the superconducting element having a top surface aligned with a top surface of the first dielectric layer;
    forming a second dielectric layer over the first dielectric layer and the superconducting element, the second dielectric layer being in contact with the top surface of the first dielectric layer and with the top surface of the superconducting element;
    forming an opening in the second dielectric layer to the top surface of the superconducting element;
    performing a cleaning process on the top surface of the superconducting element to remove oxides formed on the top surface of the superconducting element at a first processing stage;
    forming a protective barrier over the top surface of the superconducting element; and
    moving the superconductor structure to a second processing stage for further processing.

2. The method of claim 1, wherein the cleaning process is a fluorine based reactive clean process.

3. The method of claim 1, wherein the superconducting element is formed from niobium and the protective barrier is formed from niobium nitride.

4. The method of claim 1, wherein the forming the superconducting element that has a top surface aligned with the top surface of the first dielectric layer comprises:
    forming a patterned photoresist layer with an opening overlying the first dielectric layer;
    etching the first dielectric layer to form an extended opening in the first dielectric layer based on the opening in the photoresist layer;
    stripping the photoresist layer;
    performing a wet etch to remove oxide on the first dielectric layer caused by the stripping of the photoresist layer;
    performing a contact material fill to fill the extended opening; and
    performing a chemical mechanical polish (CMP) to align a top surface of the superconducting element with a top surface of the first dielectric layer, wherein the cleaning process removes oxidation on a top surface of the superconducting element and the top surface of the first dielectric layer both caused by at least the CMP.

5. The method of claim 4, wherein the forming an opening comprises:
    forming a second patterned photoresist layer with a via pattern opening overlying the second dielectric layer and aligned with the superconducting element;
    etching the second dielectric layer to form the extended opening in the second dielectric layer to the superconducting element based on the via pattern opening in the second photoresist layer; and
    stripping the second photoresist layer.

6. The method of claim 5, further comprising:
    forming a third patterned photoresist layer with a trench opening pattern overlying and surrounding the extended opening in the second dielectric layer and aligned with the superconducting element;
    partially etching the second dielectric layer to form a trench opening in the second dielectric layer based on the trench opening pattern in the third photoresist layer; and
    stripping the third photoresist layer.

7. The method of claim 6, further comprising performing a cleaning process to remove oxides formed on a top surface of the second dielectric layer and the top surface of the superconducting element due to at least the stripping of the third photoresist layer prior to the forming a protective barrier over the top surface of the superconducting element.

8. The method of claim 7, further comprising:
    performing an argon sputter clean to remove the protective barrier:
    performing a superconducting contact material fill to fill the extended opening and the trench opening;
    performing a chemical mechanical polish (CMP) to align a top surface of the superconducting element with a top surface of the second dielectric layer to form a superconductive line;
    performing a cleaning process to remove oxides formed on a top surface of the second dielectric layer and the top surface of the superconductive line; and
    forming a protective barrier on a top surface of the superconductive line to protect the superconductive line from further oxidation when being moved to a subsequent stage for further processing.

9. The method of claim 1, wherein at least one of the dielectric material employed in the first dielectric layer and the second dielectric layer is formed of a dielectric material that can form at a temperature of about or below 160° Celsius.

10. A method of forming a superconductor structure, the method comprising:
forming a first opening in a first dielectric layer overlying a substrate;
performing a wet etch to remove oxides from the first dielectric layer caused by the forming of the first opening;
forming a first superconductive line in the first opening having a top surface aligned with a top surface of the first dielectric layer;
performing a first cleaning process on the top surface of the first superconductive line and the top surface of the first dielectric layer to remove oxides from the top surface of the first superconductive line and the top surface of the first dielectric layer;
forming a second dielectric layer over the first dielectric layer and the first superconductive line;
forming a via opening in the second dielectric layer to a top surface of the superconductive line, and a trench opening surrounding the via opening and partially extending into the second dielectric layer;
performing a second cleaning process on the top surface of the first superconductive line to remove oxides formed on the top surface of the first superconductive line and the remaining portions of the superconductor structure;
forming a protective barrier over the top surface of the first superconductive line at a first processing stage to mitigate oxide formation over the top surface of the superconductive line;
moving the superconductor structure to a second processing stage for further processing;
removing the protective barrier;
forming a contact in the via opening and a second conductive line in the trench opening.

11. The method of claim 10, wherein the first and the second cleaning processes are a reactive fluorine based cleaning process.

12. The method of claim 10, wherein the first superconductive line, the contact and the second superconductive line are formed from niobium.

13. The method of claim 10, wherein the protective barrier is formed from niobium nitride.

14. The method of claim 10, wherein the removing the protective barrier comprises performing an argon sputter clean to remove the protective barrier.

15. The method of claim 10, further comprising performing a third cleaning process on the top surface of the second superconductive line to remove oxides formed on the top surface of the second superconductive line, and forming a protective barrier over the top surface of the second superconductive line to mitigate oxide formation over the top surface of the second superconductive line at a subsequent processing stage.

16. The method of claim 10, wherein at least one of the dielectric material employed in the first dielectric layer and the second dielectric layer is formed of a dielectric material that can form at a temperature of about or below 160° Celsius.

17. A method of forming a superconductor interconnect structure, the method comprising:
forming a first dielectric layer overlying a substrate
forming a patterned photoresist layer with an opening overlying the first dielectric layer;
etching the first dielectric layer to form an extended opening in the first dielectric layer based on the opening in the photoresist layer;
stripping the photoresist layer;
performing a wet etch to remove the oxide layer on the first dielectric layer caused by the stripping of the photoresist layer;
performing a contact material fill to fill the extended opening and form a first superconductive line;
performing a chemical mechanical polish (CMP) to align a top surface of the first superconductive line with a top surface of the first dielectric layer;
performing a first cleaning process on the top surface of the first superconductive line and the first dielectric layer to remove oxides formed on the top surface of the first superconductive line and the top surface of the first dielectric layer;
forming a second dielectric layer over the first dielectric layer and the first superconductive line;
forming a via opening in the second dielectric layer to a top surface of the first superconductive line, and a trench opening surrounding the via opening and partially extended into the second dielectric layer;
performing a second cleaning process on the top surface of the first superconductive line to remove oxides formed on the top surface of the first superconductive line during the forming of the via opening and trench opening;
forming a first protective barrier over the top surface of the superconducting element;
moving the superconductor structure to a subsequent stage for further processing;
performing an argon sputter clean to remove the protective barrier;
performing a superconducting contact material fill to fill the via opening and the trench opening to form a contact in the via opening and a second superconductive line in the trench opening;
performing a chemical mechanical polish (CMP) to align a top surface of the second superconductive line with a top surface of the second dielectric layer;
performing a third cleaning process to remove oxides formed on a top surface of the second dielectric layer and the top surface of the second superconductive line; and
forming a second protective barrier on the top surface of the second superconductive line to protect the second superconductive line from further oxidization when being moved to a subsequent stage for further processing.

18. The method of claim 17, wherein the first, second and third cleaning processes are a reactive fluorine based cleaning process.

19. The method of claim 17, wherein the first and second superconductive line and the first contact are formed from niobium and the first protective barrier and the second protective barrier are formed from niobium nitride.

20. The method of claim 17, wherein at least one of the dielectric material employed in the first dielectric layer and the second dielectric layer is formed of a dielectric material that can form at a temperature of about or below 160° Celsius.

* * * * *